United States Patent [19]

Henson

[11] 4,026,412
[45] May 31, 1977

[54] ELECTRONIC CIRCUIT CARRIER AND TEST FIXTURE

[76] Inventor: Richard D. Henson, 21812 Roscoe Blvd. No. 36, Canoga Park, Calif. 91304

[22] Filed: Sept. 26, 1974

[21] Appl. No.: 509,653

[52] U.S. Cl. .............................. 206/331; 206/332; 206/334; 174/138 G; 339/17 CF; 339/76
[51] Int. Cl.² .......................................... B65D 73/02
[58] Field of Search .......... 206/328, 331, 332, 334; 339/17 CF, 76, 79; 174/138 G, 117 F

[56] References Cited

UNITED STATES PATENTS

| | | | |
|---|---|---|---|
| 3,335,327 | 8/1967 | Damon et al. | 206/328 |
| 3,345,541 | 10/1967 | Cobaugh et al. | 206/328 |
| 3,348,101 | 10/1967 | Klein et al. | 339/117 CF |
| 3,407,925 | 10/1968 | Ruehlemann | 206/328 |
| 3,454,921 | 7/1969 | Coleman et al. | 206/331 |
| 3,652,974 | 3/1972 | Tems | 206/328 |
| 3,723,834 | 3/1973 | Peters | 206/331 |
| 3,731,254 | 5/1973 | Key | 206/328 |
| 3,825,876 | 7/1974 | Damon et al. | 206/328 |
| 3,846,740 | 11/1974 | Damon | 206/328 |

*Primary Examiner*—William Price
*Assistant Examiner*—Joseph M. Moy
*Attorney, Agent, or Firm*—Allan M. Shapiro

[57] ABSTRACT

Hybrid microelectronic packages contain microelectronic components for the protection and connection thereof. For protection of the microelectronic packages during storage and shipment, they are positioned within a carrier which encloses the body of the package and restrains the package leads for complete protection. Preferably the carrier has electrical access to the leads so that testing of the package can take place when the completed package is protected within the carrier.

7 Claims, 6 Drawing Figures

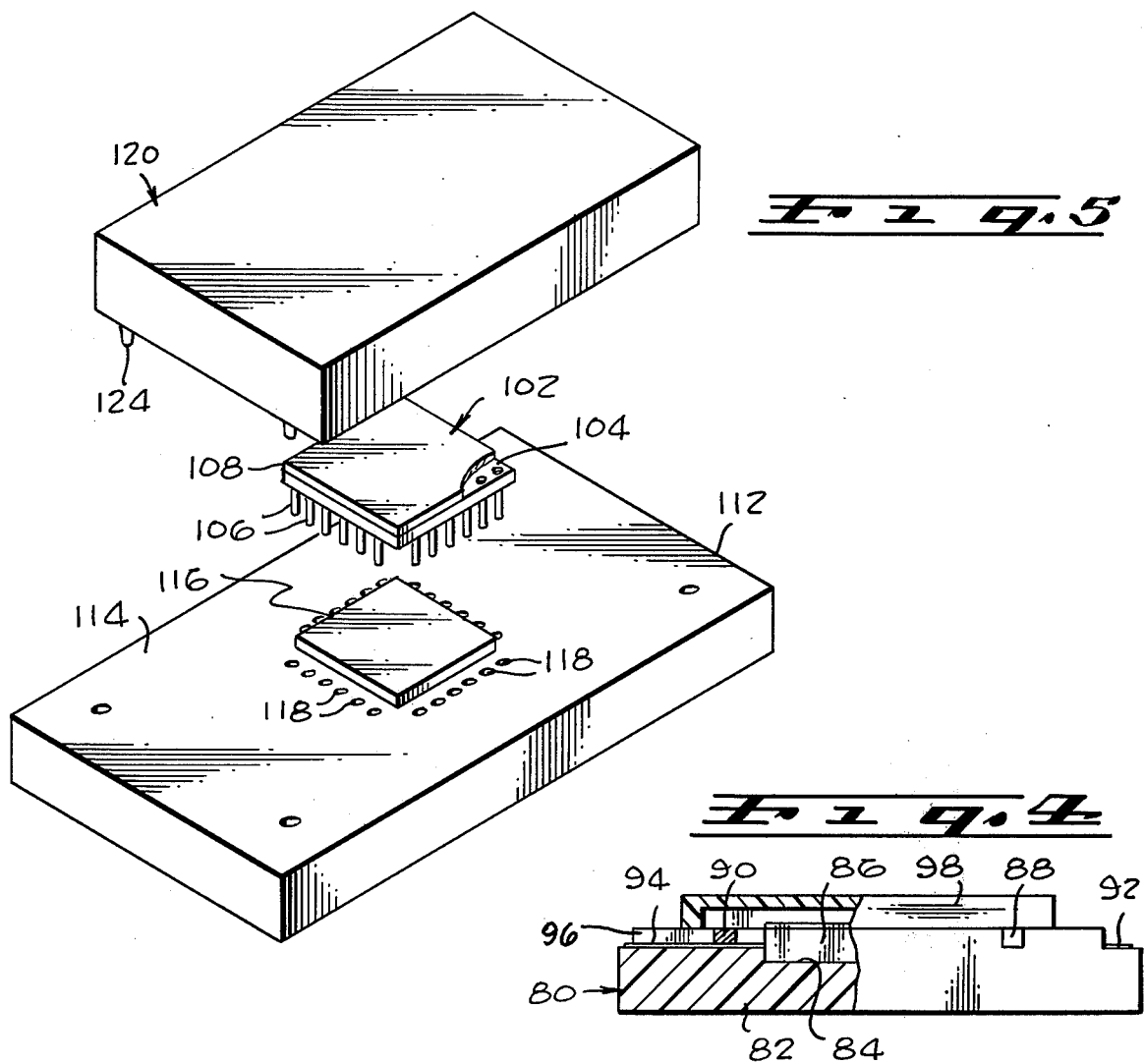
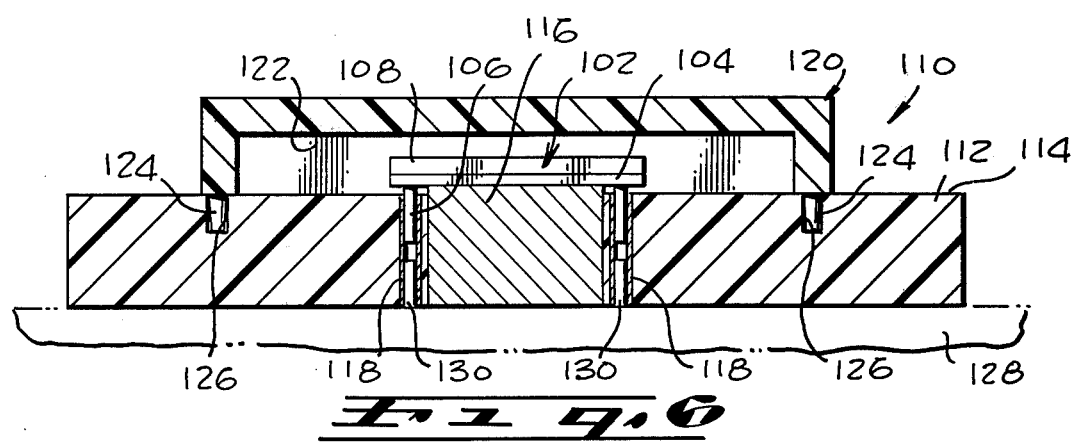

ELECTRONIC CIRCUIT CARRIER AND TEST FIXTURE

BACKGROUND OF THE INVENTION

1. Field of the Invention

This invention is directed to an electronic circuit carrier and test fixture which is arranged for the protective containment of selected hybrid thick and thin film microelectronic packages and includes the testing of the packages when they are within the protection of the carrier.

2. Description of the Prior Art

Hybrid thick and thin film microelectronic modules are very delicate when handling, testing and connecting factors are considered. Conventionally they are secured to an insulated substrate which has printed circuitry thereon for connection. Sometimes several semiconductor chips are secured to the same insulated substrate, and are interconnected by etched thick and thin film circuitry thereon. Often the substrates are ceramic devices to provide a base for the semiconductor chip, to support the printed circuitry and to provide a structure of adequate size for handling. Next, these devices are placed in hybrid microelectronic packages for protection of the electronic devices. There are a number of different types of such packages. The broadest range of styles of metal hybrid microelectronic packages is available from Tekform Products Company of Anaheim, Calif. Various such packages are also available from other manufacturers.

The management of the hybrid microelectronic packages during manufacturing storage and transportation has resulted in damage to the package leads. The package leads are bent and must be individually straightened before they can be employed in further processing. Furthermore, testing of the integrated circuit electronics in the hybrid microelectronic packages requires individual care because the leads of the packages may not be correctly oriented.

SUMMARY OF THE INVENTION

It can be stated in essentially summary form that this invention is directed to an electronics circuit carrier. The carrier is configured to receive a package and restrain the leads of the hybrid microelectronic package. In the embodiment which includes testing, it is also arranged for providing electric connections to the leads of the hybrid microelectronic package and making the connection accessible from the outside of the test fixture.

It is thus an object of this invention to provide a carrier for the containment of a hybrid microelectronic package for its protection during shipping and storage. It is another object to provide a carrier for a hybrid microelectronic package which includes connection so that the package can be tested while protected by the carrier. It is a further object to provide a carrier for a hybrid microelectronic package which includes restraints for the package leads so that the leads are protected during storage and shipping. It is a further object to provide a carrier which includes a cover over the hybrid microelectronic package carried therein for the protection of the entire package structure. It is a further object to provide in such packages interconnections so that the leads of the package can be electrically reached for the electrical testing of the package when it is thus protected or CMOS devices can be provided with a protective shorting bar which can be removed at the time of test.

The features of the present invention which are believed to be novel are set forth with particularity in the appended claims. The present invention, both as to its organization and the manner of operation, and together with further objects and advantages thereof, may be understood best by reference to the following description taken in connection with the accompanying drawings.

BRIEF DESCRIPTION OF THE DRAWINGS

FIG. 4 is a side elevational view with parts broken away and parts shown in section, of a carrier of the general type shown in FIG. 1, but without the provision for package testing.

FIG. 5 is an exploded isometric view of another embodiment of the electronic circuit carrier and test fixture particularly arranged for the carrying, protecting and testing of a hybrid microelectronic package in the platform configuration.

FIG. 6 is a longitudinal section therethrough, with the carrier in closed position.

DESCRIPTION OF THE PREFERRED EMBODIMENT

Figures 1, 2, 3:
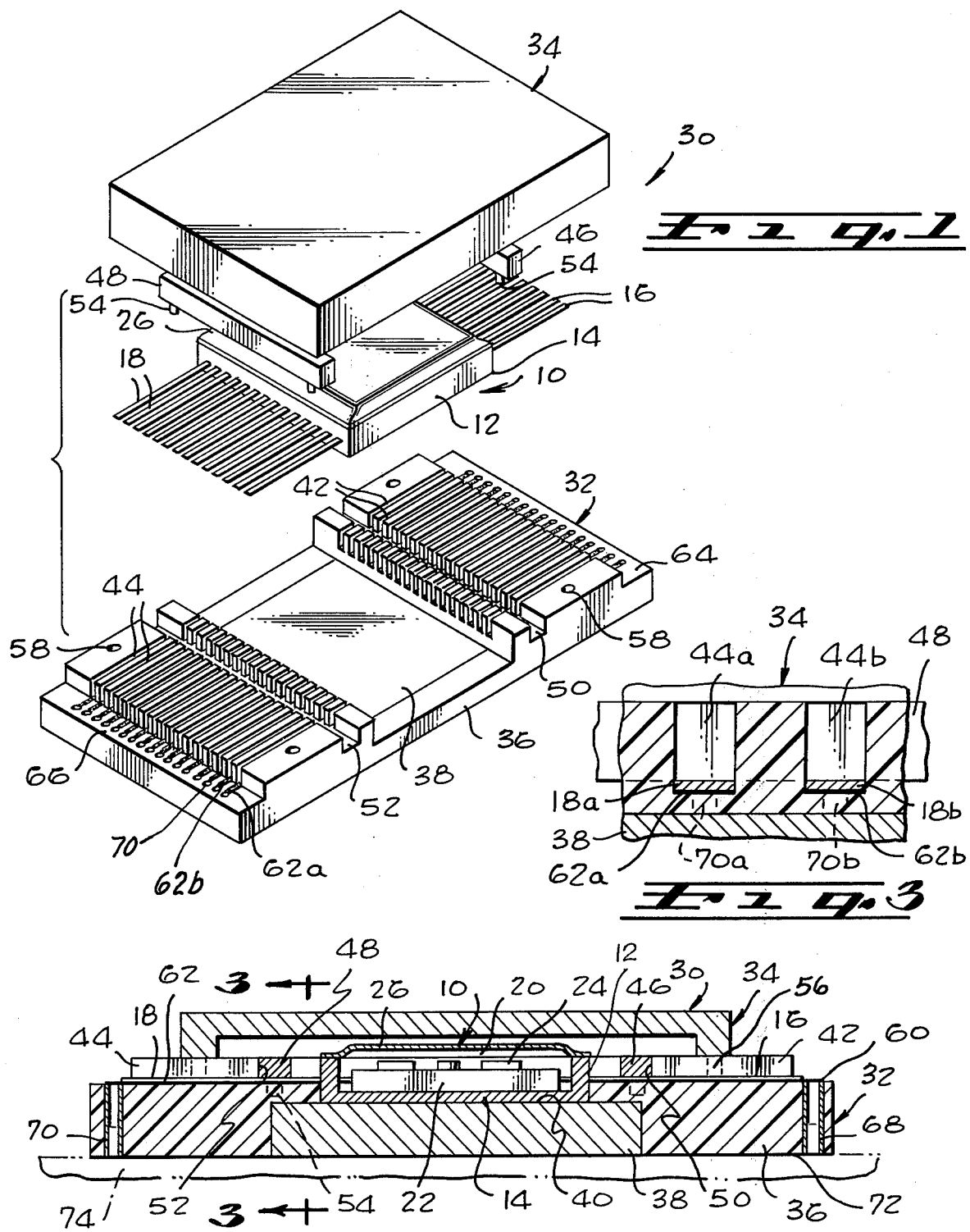
FIG. 1 is an exploded view of an embodiment of the electronics circuit carrier and test fixture of this invention which is particularly arranged to carry and protect a hybrid microelectronic package of butterfly form.
FIG. 2 is an enlarged longitudinal section therethrough in the enclosed position.
FIG. 3 is a further enlarged section with parts broken away, taken generally along line 3—3 of FIG. 2.

FIGS. 1, 2 and 3 show a hybrid microelectronic package 10. Package 10 is illustrated as being in the form of a butterfly case which has four metallic sidewalls 12 which extend upward from metallic base 14. A plurality of leads 16 extend through one of the sidewalls and are insulated with respect thereto while a plurality of leads 18 extend out through another sidewall and are insulated with respect thereto. The sidewalls and base form a chamber 20 for the positioning therein of an insulated substrate 22 which carries appropriate printed circuitry and microelectronic circuit chips 24, which are usually integrated circuit chips. The circuit chips are electrically connected to the interior ends of leads 16 and 18 where they extend into chamber 20. Cover 26 closes chamber 20 to fully protect the equipment therein. A sealed environment is possible. While a particular electronic package 10 in the form of a butterfly case is illustrated, for the purpose of illustrating this invention, the carrier and test fixture are equally suitable for use with flat packs and dihedral cases (see U.S. Pat. No. 3,539,704). In each of these packages, the leads extend laterally from the sides of the case and thus are useable in a similar manner.

The embodiment of the electronic circuit carrier and test fixture of this invention which is especially configured to be useful with the microelectronic package 10 is generally indicated at 30 in FIGS. 1 and 2. Carrier 30 comprises base 32 and cover 34. First considering base 32 in detail, base 32 comprises body 36 which is formed of an insulator material, such as chopped fiberglass filled epoxy. Positioned within body 36 is metallic heat sink 38. Body 36 is recessed at 40 to receive microelectronic package 10 so that the metallic base 14 of the microelectronic package lies against heat sink 38 in recess 40. Extending longitudinally outward from recess 40 and parallel to each other are slots 42 and 44. These slots are formed into the top of the body and extend downward toward the bottom of recess 40. The bottom of the slots are positioned above the bottom of the recess 40 substantially equal to the height of the leads 16 and 18 above the bottom of package 10. Thus, in FIG. 3 leads 18a and 18b respectively lie toward the bottoms of slots 44a and 44b. In this way, each of the leads 16 and 18 is protected against damage.

In order to hold package 10 in place, and particularly retain the leads 16 and 18 respectively in the bottoms of their retaining slots 42 and 44, hold down bars 46 and 48 are provided. Transverse slots 50 and 52 are formed in body 36 transversely to the slots 42 and 44, with the transverse slots 50 and 52 preferably extending down as far as the slots 42 and 44 are formed in the body 36. Hold down bars 46 and 48 respectively fit down into the transverse slots 50 and 52 to clamp the leads down into the bottom of the retaining slots. Pin 54 at each end of each of the fold down bars 46 and 48 frictionally engages in a corresponding hole in body 36 to retain the hold down bars in place.

Cover 34 engages over the top of the hold down bars and over the top of package 10. Cover 34 has an interior recess to provide adequate room for package 10. Cover 34 is held in place by cover retaining pins 56 positioned appropriately around the underside of the cover, for example at the corners as indicated, which engage in cover retaining pin holes 58. The cover retaining pins are preferably tapered and engage in tapered holes for adequate cover retention for protection of the package.

This is sufficient structure for protection of the package during storage and shipment. However, the carrier and test fixture 30 has additional structure which permits the package to be tested while it is in the carrier. A conductor 60 lies in the bottom of each of the retaining slots 42 and a conductor 62 lies in the bottom of each of the retaining slots 44. These conductors are electrically insulated from each other. As previously discussed, the bottom of the retaining slots is substantially as low as the bottom of the transverse slots for the hold down bars, but the conductors lie across the top of the bottom surface of the transverse slots 50 and 52. As is seen in FIG. 3, conductors 62a and 62b are respectively positioned in the bottom of retaining slots 44a and 44b. Hold down bar 48 holds the leads 18a 18b respectively down onto the conductors 62a and 62b. At the outer ends of the conductors, body 36 is notched at 64 and 66. These notches are substantially the same depth as the transverse slots 50 and 52. The conductors 60 and 62 extend onto the top surface at the notches. Connector ways 68 and 70 are formed in sets downward through the notches, with a way extending downward below each conductor. Each way contains a conductor, such as through plating, which is connected to the various conductors 60 and 62. Connector ways 70a and 70b are seen in FIG. 3. In this way, electrical contact is brought out at back 72 of base 32.

Test fixture 30 is mounted on a mother board 74 which has suitable electrical connections to test the microelectronic circuit in package 10. From the circuit chips 24 leads extend to the printed circuitry on the top of substrate 22, and thence to the leads 16 and 18. Leads 16 and 18 are respectively individually pressed down onto the conductors 60 and 62. The conductors 60 and 62 are respectively connected by ways 68 and 70 to the mother board. In this way, the microelectronic circuit package can be tested while it is protected by the carrier in test fixture 30. FIGS. 1–3 illustrate the preferred embodiment where leads extend out of one of the package edges.

FIG. 4 illustrates a microelectronic package carrier 80 which is similar to the carrier 30. Carrier 80 has a base 82 which includes a recess 84 for a microelectronic package 86 which is the equivalent of package 10. Hold down bars 88 and 90 hold the package leads 92 and 94 down into slots 96 in which the leads are retained and thus protected. Cover 98 encloses the top over the package 86 for its full protection. The carrier 80 is not equipped with leads in the bottom of the slots 96 and thus is unequipped for testing of the package in situ. Without such testing, no heat sink is necessary and is not provided in carrier 80. Thus, the carrier 80 is simply for the protection of package in storage and shipment.

Considering the embodiment illustrated in FIGS. 5 and 6, microelectronic package 102 comprises a base or platform 104 from which connector pins 106 extend downwardly. Each of the connector pins 106 is insulated with respect to the metallic platform. Substrate 108 is positioned on top of platform 104 and its circuitry is connected to connector pins 106. Usually substrate 108 is an insulator with printed circuitry thereon and microelectronic circuit chips are secured to the substrate and are electrically connected to the printed circuitry. The printed circuitry in turn is connected to pins 106. A cover can be placed over the electronic components on platform 104, if desired.

In the carrying and testing of package 102, carrier and test fixture 110 is provided. Carrier and test fixture 110 comprises a base 112 which has an upper surface 114. Heat sink 116 is mounted on the top of the surface 114. Ways 118 are positioned around heat sink 116 in an appropriate organization to receive connector pins 106. Ways 118 are through plated or contain electrically conductive hollow rivets or the like for receiving pins 106, making electrical connection thereto. Base 112 is preferably formed of insulator material so that it maintains electrical separation of the pins in the plating of ways 118. A chopped fiberglass filled epoxy is suitable material.

Cover 120 has an interior recess 122 to engage over microelectronic circuit package 102, to protect the package. Cover 120 is preferably of the same material as base 112. Pins 124 extend downward from the cover and engage in corresponding holes 126 in base 112. A frictional fit is desirable so that the cover is retained fairly firmly in place, but can be removed for access to microelectronic circuit package 102. Thus, the microelectronic circuit package 102 is fully protected in storage and shipment.

Mother board 128 has upstanding pins 130 which engage into the ways 118. Mother board 128 has appropriate electrical connections thereon for the testing of microelectronic circuit package 102. Thus, the microelectronic circuit in package 102 can be tested while it is in the protection of the carrier and test fixture 110. In that way, access is not required during testing for the full protection of the circuitry and pin and conductor alignment.

It is clear that the particular size and shape of heat sink 116, and the positioning of ways 118 is directly related to a particular configuration of platform 104. Other configurations for other shapes of microelectronic circuit packages which have connector pins extending out of one side can also be employed in this type of carrier and test fixture. Thus, the heat sink 116 may be circular or rectangular, while the ways 118 may similarly be circularly or rectangularly arranged. Carrier and test fixture 110 thus illustrates the preferred embodiment of the invention where in the connection pins extend out of one face of the microelectronic circuit package.

While particular embodiments of the present invention have been shown and described, it will be obvious to those skilled in the art that changes and modifications may be made without departing from this invention in its broader aspects and, therefore, the aim in the appended claims is to cover all such changes and modifications as fall within the true spirit and scope of this invention.

What is claimed is:

1. An electronic circuit carrier for carrying and protecting a microelectronic circuit in a package, where the microelectronic circuit package has a case for carrying a microelectronic circuit thereon, and has connector leads mounted on the case and insulated from the case and extending from the case, said microelectronic circuit package carrier comprising:
   a body made of electrically nonconductive material and having a top surface, a plurality of connector lead openings comprising a plurality of parallel slots formed in the top surface of said body and spaced for reception of the connector leads on a package so that the connector leads are retained in position and protected against bending resulting from physical striking of the connector leads;
   a recessed support surface formed in said top surface of said body, said support surface being of sufficient size to support and engage a microelectronic circuit package thereon and being positioned so that the microelectronic circuit package lies against said support surface when the microelectronic circuit package leads lie in said connector lead openings;
   a heat sink positioned in said body and serving as at least part of said support surface so that the microelectronic circuit package rests against said heat sink when its connector leads are positioned in said connector lead openings;
   transverse slots formed below the top surface of said body and transversely to said connector lead retaining slots;
   hold down bars positionable within said transverse slots for holding down connector leads in the bottom of said retaining slots; and
   a cover for engagement over the portion of said top surface occupied by a microelectronic circuit package so that both the package and its connector leads are protected against physical damage.

2. The electronic circuit carrier of claim 1 wherein:
   a conductor is positioned in the bottom of each said connector lead retaining slots, each of said conductors being connectable for testing of the microelectronic circuit package retained in said carrier.

3. The electronic circuit carrier of claim 2 wherein:
   said conductors are strips positioned in the bottom of said connector lead retaining slots and further including electrically conductive ways extending from said front to the back of said body so that test connection can be made to the back of said carrier body.

4. An electronic circuit carrier for carrying and protecting a microelectronic circuit in a package, where the microelectronic circuit package has a case for carrying a microelectronic circuit thereon, and has connector leads mounted on the case and insulated from the case and extending from the case, said microelectronic circuit package carrier comprising:
   a body having a top surface, a recess formed in said top surface of said body, said recess being of sufficient size to accept a microelectronic circuit package carrier;
   a plurality of connector lead openings in the form of parallel slots formed below the top surface of said body, said slots being spaced to receive the connector leads on a package so that the connector leads are protected against bending;
   transverse slots formed below the top surface of said body and transversely to said connector lead retaining slot, and hold-down bars positionable within said transverse slots for holding down connector leads in the bottom of said retaining slot; and
   a cover for engagement over the portion of said top surface occupied by a microelectronic circuit package so that both the package and its connector leads are protected against physical damage.

5. The electronic circuit carrier of claim 4 wherein:
   a conductor is positioned in the bottom of each said connector lead retaining slots, each of said conductors being connectable for testing of the microelectronic circuit package retained in said carrier.

6. The electronic circuit carrier of claim 5 wherein:
   said conductors are strips positioned in the bottom of said connector lead retaining slots and further including electrically conductive ways extending from said front to the back of said body so that test connection can be made to the back of said carrier body.

7. The electronic circuit carrier of claim 6 wherein:
   said body is made of electrically nonconductive material and a thermal heat sink is positioned in said body at the bottom of said recess so that a microelectronic circuit package in said carrier rests against said heat sink.

* * * * *